United States Patent

Vonasek et al.

Patent Number: 5,518,952
Date of Patent: May 21, 1996

[54] METHOD OF COATING A PIEZOELECTRIC SUBSTRATE WITH A SEMICONDUCTING MATERIAL

[75] Inventors: Jiri Vonasek, deceased, late of Kungälv, by Tor Erik Nygren, executor; Stig G. Larsson, Kållered; Ove Andersson, Västra Frölunda, all of Sweden

[73] Assignee: Markpoint Development AB, Sweden

[21] Appl. No.: 290,975

[22] PCT Filed: Feb. 1, 1993

[86] PCT No.: PCT/SE93/00072

§ 371 Date: Sep. 20, 1994

§ 102(e) Date: Sep. 20, 1994

[87] PCT Pub. No.: WO93/17147

PCT Pub. Date: Sep. 2, 1993

[30] Foreign Application Priority Data

Feb. 25, 1992 [SE] Sweden ............ 92005552

[51] Int. Cl.⁶ .................................................. H01L 21/324
[52] U.S. Cl. .................. 437/82; 427/100; 427/255; 427/255.1; 427/255.2; 427/331
[58] Field of Search ............................ 427/100, 255, 427/255.1, 255.2, 331; 437/82

[56] References Cited

U.S. PATENT DOCUMENTS

| | | | |
|---|---|---|---|
| 4,367,478 | 1/1983 | Larsson | 346/140 R |
| 4,485,121 | 11/1984 | Matsumura | 427/39 |
| 4,719,477 | 1/1988 | Hess | 346/140 R |
| 4,762,808 | 8/1988 | Sharp et al. | 437/101 |
| 4,819,014 | 4/1989 | Yasuhara et al. | 346/140 R |
| 4,847,639 | 7/1989 | Sugata et al. | 346/140 R |
| 4,905,019 | 2/1990 | Vonasek | 346/75 |

FOREIGN PATENT DOCUMENTS

| | | | |
|---|---|---|---|
| 0143701 | 6/1985 | European Pat. Off. | C23C 16/24 |
| 0296702 | 12/1988 | European Pat. Off. | H01L 21/205 |
| 0431338 | 6/1991 | European Pat. Off. | B41J 2/16 |
| WO9210367 | 6/1992 | WIPO | B41J 2/16 |

*Primary Examiner*—Benjamin Utech
*Attorney, Agent, or Firm*—Lerner, David, Littenberg, Krumholz & Mentlik

[57] ABSTRACT

Methods of coating piezoelectric substrates with substantially uniform layers of a semi-conducting material are disclosed including placing the substrate in a heated deposition chamber at reduced pressure and depositing a layer of semiconducting material on the substrate by thermally activated chemical vapor deposition, including admitting a gas bearing the semi-conducting material into the chamber at a pressure of between about 13 and 200 Pa and a temperature of between about 300° and 700°C. so that a layer of semi-conducting material having a desired smoothness is obtained.

19 Claims, 1 Drawing Sheet

5,518,952

METHOD OF COATING A PIEZOELECTRIC SUBSTRATE WITH A SEMICONDUCTING MATERIAL

FIELD OF THE INVENTION

The present invention relates to methods of coating piezoelectric substrates. More particularly, the present invention relates to methods of coating piezoceramic wafers with a substantially uniform layer of a semi-conducting material. Still more particularly, the present invention relates to methods of producing droplet ejector arrangements. More particularly, the present invention also relates to the use of piezoceramic wafers having a substantially uniform layer of a semi-conducting material thereon.

BACKGROUND OF THE INVENTION

In the course of their work in the field of piezoelectric pumps, the applicants have recognized that there is a need for means to coat piezoelectric substrates with a semi-conducting material which is susceptible to doping or other techniques for the purpose of imparting electrically-conducting properties to the coating. Such substrates are particularly suitable for use in ink-jet printing devices of the type described in applicants' International Patent Application No. PCT/EP90/02119, filed on Dec. 6, 1990, in which a piezoceramic wafer having planar opposite first and second surfaces has grooves or channels extending inwardly therein. The groove or grooves of the first planar surface lie offset to the groove or grooves of the second planar surface with the grooves partially overlapping in the direction of their depth. Each groove of one of these surfaces is intended to function as a droplet ejector channel. This is accomplished by providing defined areas of the piezoceramic wafer with a conductive coating, thereby forming electrodes for each ejector channel. Thereafter, the material can be polarized by applying an electrical voltage between the electrodes. An electrical pulse is subsequently applied across the electrodes, causing a rapid decrease in the volume of the ejector channel, thereby effecting discharge of the liquid from within the channel. Discharge of the liquid in a longitudinal direction is assured by covering the open longitudinal extension of the ejector channels with a cover plate. This cover plate also serves to impart stability to the piezoceramic wafer.

Even though the above-described type of ink-jet printing device theoretically offers a much more versatile printing system, its usefulness has, at least up to now, been hampered by the difficulty in obtaining a satisfactory bond between the cover plate and the coated piezoceramic wafer. This is because satisfactory bonding is very much dependent on the smoothness of the surfaces which are to be bonded. It is relatively easy to obtain an adequately smooth surface on the cover plate since in most cases the cover plate is made from glass. Difficulties arise, however, with the coated piezoceramic wafer. A satisfactory degree of smoothness can be imparted on the piezoceramic wafer itself, and this must then be maintained after application of the electrode coating. Thus, the coating process must result in a piezoceramic wafer having an electrode coating with a sufficiently smooth surface.

When the applicants have performed electrode application methods which result in a crystalline coating of semiconducting material, they have been found to be too uneven to be bonded by, for example, anodic bonding, unless subjected to subsequent smoothing operations. Attempts have also been made to bond a crystalline silicium-coated piezoceramic wafer obtained by chemical vapor deposition (CVD) to glass by distributing adhesive over the glass cover plate by means of centrifugal spinning. In order to avoid the need for an adhesive agent, attempts have been made to coat piezoceramic wafers by means of sputtering. While sputtering results in a relatively smooth coating, sputtering techniques cannot provide an ejector channel for an ink-jet printing device whose side walls are adequately coated with electrode material.

A CVD method for producing either an undoped or a doped amorphous silicium coating on unspecified substrates is disclosed in EP-A-0 143 701. In this method, the coating is achieved by thermally decomposing disilane within a heated quartz chamber containing the substrates. This method reputedly offers the advantage that disilane is obtained within the chamber by a chemical reaction between silane and atomic hydrogen.

It is therefore an object of the present invention to provide a method of coating a piezoelectric substrate, and preferably a piezoceramic substrate, and preferably in the form of a wafer, with a substantially uniform layer of a semi-conducting material, which resulting layer is sufficiently smooth to allow bonding between the thus coated piezoelectric substrate and a cover plate.

SUMMARY OF THE INVENTION

In accordance with the present invention, this and other objects have now been accomplished by the discovery of a method of coating a piezoelectric substrate with a substantially uniform layer of semiconducting material which comprises placing the substrate in a heated deposition chamber at reduced pressures and depositing a layer of semi-conducting material on the substrate by thermally activated chemical vapor deposition, the depositing step comprising admitting a gas bearing the semi-conducting material into the chamber at predetermined pressure and temperature conditions such that the layer of semiconducting material has a desired smoothness, the predetermined pressure being between about 13 and 200 Pa and the predetermined temperature being between about 300° and 700° C. Preferably, the semi-conducting material is silicon or germanium, the predetermined pressure is about 33 Pa, and the predetermined temperature is between about 500° and 530° C.

In accordance with one embodiment of the method of the present invention, the depositing step further includes admitting a doping agent in gaseous form into the chamber simultaneous with the gas bearing the semi-conducting material. In a preferred embodiment, the doping agent is mixed with the gas bearing the semi-conducting material in a quantity of between about 0.01 and 1.0% by volume of the gas bearing the semi-conducting material.

In accordance with another embodiment of the method of the present invention, the method includes doping the layer of the semi-conducting material with a doping agent after the depositing step. Preferably, the doping agent is phosphine or boron.

In accordance with another embodiment of the method of the present invention, the method includes admitting a vaporized metal into the chamber after the layer of semiconducting material has been deposited on the substrate. Preferably, the vaporized metal is palladium, nickel or tungsten. In another embodiment, the method includes sintering the metal so as to bond the metal to the layer of semi-conducting material.

In accordance with another embodiment of the method of the present invention, the method includes exposing the substrate to a temperature of between about 650° and 700° C. before the depositing step.

In accordance with yet another embodiment of the method of the present invention, the method includes purging the chamber before the depositing step so as to clean the substrate. Preferably, the purging is carried out utilizing hydrogen at a temperature of about 500° C.

In accordance with another embodiment of the method of the present invention, the method includes removing the substrate from the chamber following the depositing step, and flushing the chamber with nitrogen thereafter.

In accordance with another method of the present invention, methods for producing a droplet ejector have been discovered including providing a piezoceramic wafer having first and second opposite planar surfaces, forming at least one longitudinally extending groove in the first planar surface so as to provide an ejector channel for a liquid, forming a plurality of grooves in the second planar surface, the plurality of grooves being offset relative to the at least one groove in the first planar surface and partially overlapping the at least one groove in the first planar surface in a direction perpendicular to the first and second opposite planar surfaces, providing a nozzle at one end of the at least one groove in the first planar surface, depositing a layer of a semiconducting material on the piezoceramic wafer by thermally activated chemical vapor deposition, the depositing including placing the wafer in a heated deposition chamber at reduced pressures and admitting a gas bearing the semi-conducting material into the chamber at predetermined pressure and temperature conditions such that the layer of semi-conducting material has a desired smoothness, the predetermined pressure being between about 13 and 200 Pa and the predetermined temperature being between about 300° and 700° C., so as to form electrodes, removing the layer of semi-conducting material from preselected regions of the substrate, and polarizing the ejector by applying a voltage between the electrodes.

In a preferred embodiment of the method of the present invention, the method includes bonding a cover plate to the wafer at a location so as to limit a longitudinal opening of the at least one groove in the first planar surface. Preferably, the bonding comprises anodic bonding, and the cover plate is glass.

In accordance with the present invention, it also has been discovered that thermally activated low pressure chemical vapor deposition can be utilized to obtain a substantially uniform layer of semi-conducting material of desired smoothness on a piezoelectric, and preferably piezoceramic, substrate.

BRIEF DESCRIPTION OF THE DRAWINGS

The following detailed description of the present invention can be more fully appreciated by reference to the accompanying drawings in which.

DETAILED DESCRIPTION

Figure 1:
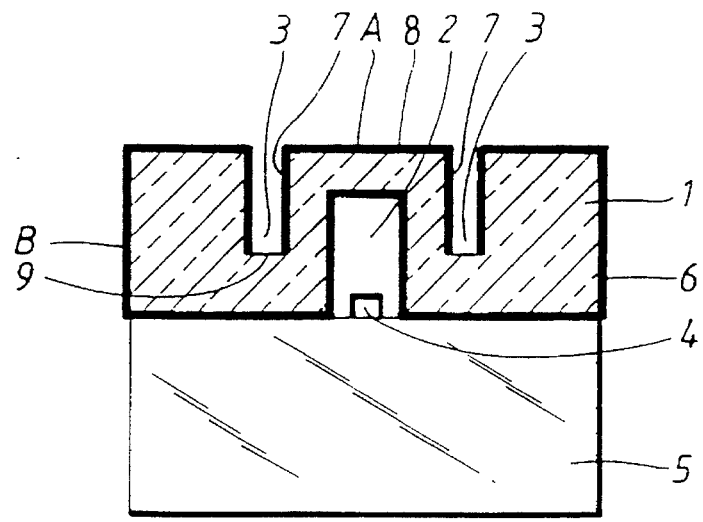
FIG. 1 is a partially schematic, cross-sectional view of a droplet ejector whose piezoceramic wafer has been coated with a semi-conducting material in accordance with the method of the present invention.

Referring to the Figures, the droplet ejector arrangement shown in FIG. 1 comprises a piezoelectric, and preferably piezoceramic, wafer 1 having formed on one side thereof a longitudinally extending ejector channel 2 and, on the opposite side, a pair of longitudinally extending separation grooves 3. As is clear from FIG. 1, the separation grooves lie in a plane which is offset relative to the plane of the ejector channel, and partially overlap the ejector channel in the direction of their depth; i.e., perpendicular to the surfaces of the wafer. In a manner known from PCT/EP90/02119, the ejector channel 2 is provided with an ejector nozzle 4. The ejector channel 2 is delimited along its longitudinally extending opening by a cover plate 5, which is made of glass in the example shown in FIG. 1.

As indicated by the heavier lines in FIG. 1, the piezoceramic wafer is provided with a layer 6 of a semi-conducting material on the majority of its surfaces. More specifically, the layer of semiconducting material coats two distinct regions, A and B, of the wafer 1. Region A includes the adjacent side wall surfaces 7 of the separation grooves 3 and the outwardly facing surface 8 of the wafer between side wall surfaces 7. Accordingly, a U-shaped region is coated, which region A acts as a first electrode for the ejector arrangement. Region B includes all of the remaining peripheral surfaces exposed in the cross-sectional view, wit the exception of the base surface 9 of each separation groove 3. Region B thus forms a second electrode for the ejector arrangement, which electrode coats all of the surfaces of the ejector channel 2.

Figure 2:
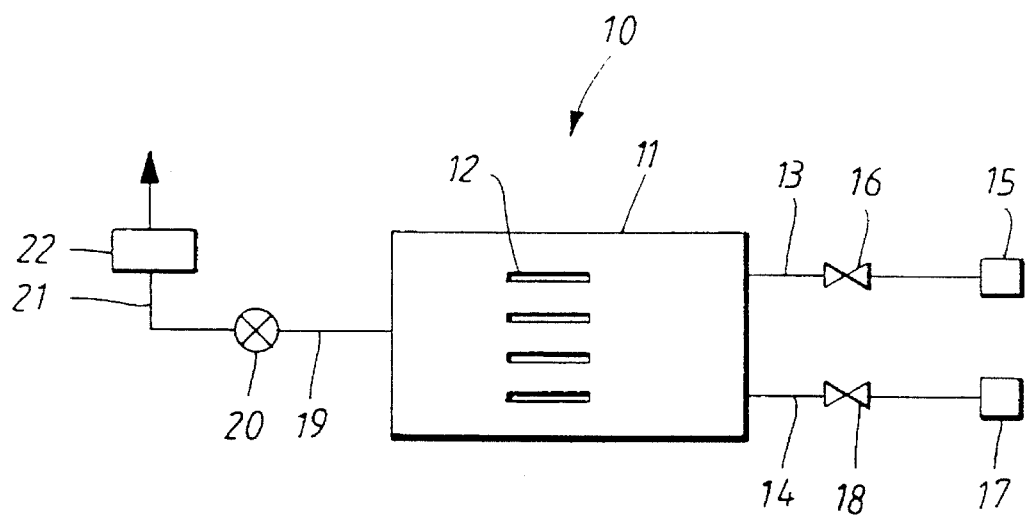
FIG. 2 is a schematic block diagram representing apparatus suitable for carrying out the method according to the present invention.

Chemical vapor deposition apparatus suitable for performing the method of obtaining a semi-conducting material coating on a piezoelectric substrate in accordance with the present invention is shown in schematic form in FIG. 2. This apparatus is in the form of a system 10 comprising a heated chamber 11 in which deposition of a semi-conducting material on one or more piezoelectric substrates 12 takes place. The chamber 11 is provided with heating means (not shown) to allow a temperature of up to 705° C. to be attained. Two supply conduits 13, 14 are shown entering the chamber 11. One conduit 13 is connected to a supply 15 of a semiconducting material-bearing gas, such as silane, through a pressure valve 16. In one embodiment according to the present invention the other conduit 14 is connected to a supply 17 of a doping agent, such as phosphine, again through a pressure valve 18. A conduit 19 is shown exiting the chamber 11, and is connected to a vacuum generator 20 in the form of a pump or the like. An exhaust conduit 21 runs from the vacuum generator 20 to a burner assembly 22, in which exhausted gases are burnt off.

In accordance with the method of the present invention, one or more piezoelectric, and preferably piezoceramic, substrates, preferably in the form of a wafer, are placed within the chamber 11. The temperature within the chamber is raised, and the pressure therein is reduced. When the temperature and pressure have reached predetermined suitable levels, the gas, e.g., silane, is admitted into the chamber. As a result of the heat and pressure conditions, a layer of semi-conducting material, in this case silicium, is deposited on the piezoceramic substrates. The surface smoothness of the deposited material has been found to be dependent primarily on the temperature in the chamber, with smoother surfaces being obtainable at lower temperatures. Indeed, under certain conditions, the resulting deposited layer can be said to be amorphous in its structure. The rate of deposition is dependent on the temperature and pressure parameters, as well as the flow rate of semi-conducting material-carrying gas into the chamber, and typically can lie between 500 and 5,000 angstroms/hour. The resulting hydrogen is removed from the chamber and is burnt off.

Semi-conducting material-coated piezoceramic wafers produced in accordance with the above-described method are eminently suitable for direct bonding to a cover plate when the semi-conducting material coting is amorphous, and thereby much smoother than crystalline coatings. Furthermore, the above-described chemical vapor deposition method results in a very uniform semiconducting material coating over all of the exposed surfaces of the substrate, substantially independent of the orientation of the substrate in the chamber.

Tests have shown that the pressure within the chamber may be maintained between about 13 and 200 Pa (100 and 1,500 mTorr). Especially favorable results have been achieved with a pressure of 33 Pa (250 mTorr). A preferred temperature range is from about 300° to 700° C., with particularly favorable results being obtained between about 500° and 530° C., and especially at about 520° C.

For many applications, it may be advantageous for the semi-conducting material coating to be doped at the same time that it is deposited on the substrate. If this is desired, then the semi-conducting material must be susceptible to doping. Suitable such materials are, for example, silicium and germanium. In order to achieve doping, in accordance with a preferred embodiment of the present invention, a doping agent in gaseous form is admitted to the chamber 11 through conduit 14 simultaneously with the silane. A suitable doping agent-carrying gas may be phosphine or boron. In FIG. 2 the doping agent-carrying gas is shown as being supplied to the chamber 11 through conduit 1, although it is, of course, conceivable that the two gases can be mixed before entering the chamber. A suitable quantity of doping agent-carrying gas is from about 0.01 to 1.0% by volume of the semi-conducting material-carrying gas. Whilst it is preferable to dope the semi-conducting material during deposition, it is also feasible to dope the semi-conducting material coating in a separate, subsequent step.

To ensure improved adhesion of the coating of semi-conducting material to the substrate, it is often advantageous to supply hydrogen to the chamber, preheated to about 500° C., with the substrate in situ before the coating material-carrying gas is admitted, so as to aggressively clean the surfaces of the substrate.

Alternatively, or in combination with the above, the surfaces of the substrate can be effectively deactivated by raising the temperature in the chamber 11 to about 750° C. for a short period of time before deposition commences. The temperature is then reduced to the desired level, dependent on the degree of surface smoothness and deposition rate which is required, and the silane or other suitable gas, with or without a doping agent, is then introduced into the chamber.

Once a sufficiently thick layer of the semiconducting material has been deposited on the substrate(s), the chamber 11 and the outlet/exhaust conduits 19, 21 may be flushed with nitrogen.

In accordance with the present invention, a droplet-ejector arrangement of the type shown in FIG. 1 can be produced in the following manner. Firstly, longitudinally extending grooves 2, 3 are formed on either side of a non-polarized piezoceramic wafer 1. The grooves may be formed using a circular saw or some other type of cutting implement, or may be formed by a molding or pressing procedure. In the example shown, only one ejector channel 2 is formed, but it will be clear to those of ordinary skill in the art that a plurality of such ejector channels can be provided, if desired.

Once the ejector channel and separation grooves have been formed, the wafer is placed in the heating chamber as shown in FIG. 2, and coating takes place in accordance with the procedure described above. Once an adequately thick layer of doped semi-conducting material is deposited on the wafer, the wafer is withdrawn from the chamber 11 and the deposited material is removed from the base surface 9 of each separation groove 3. Thereafter, the wafer is polarized by applying a voltage between the electrodes of the ejector channel 2. The coated wafer is then bonded directly to the cover plate 5, which may be made of glass, for example, without any further treatment. A preferred bonding method is anodic bonding, in which a voltage is applied across the cover plate 5 and the electrode covering the region B of the wafer to create a positive electric field from the coating material to the cover plate.

In the further embodiment according to the present invention, in order to impart electrically-conductive properties to the semi-conducting material coating, instead of admitting a doping agent-carrying gas to the chamber 11, a vaporized metal is admitted once the semi-conducting material has been deposited on the wafer. Suitable such metals are palladium, nickel and tungsten. The precipitated metal is then bonded to the semi-conducting material layer by sintering.

Naturally, the present invention is not restricted to that described above, but may be varied within the scope of the following claims. For example, although the described coating methods are eminently applicable to the manufacturing if ink-jet printer heads, it is to be understood that the claimed method may also be applied to any use of electroded piezoelectric material.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

We claim:

1. A method of coating a piezoelectric substrate with a substantially uniform layer of a semi-conducting material comprising placing said substrate in a heated deposition chamber at reduced pressure; and depositing a layer of semi-conducting material on said substrate by thermally activated chemical vapor deposition, said depositing comprising admitting a gas bearing said semi-conducting material into said chamber at pressure and temperature conditions such that said layer of semiconducting is substantially smooth, said pressure being between about 13 and 200 Pa and said temperature being between about 300° and 700° C.

2. The method of claim 1 wherein said semi-conducting material is selected from the group consisting of silicon and germanium.

3. The method of claim 1 wherein said pressure is about 33 Pa.

4. The method of claim 1 wherein said temperature is between about 500° and 530° C.

5. The method of claim 1 wherein said depositing further comprises admitting a doping agent in gaseous form into said chamber simultaneous with said gas bearing said semi-conducting material.

6. The method of claim 5 wherein said doping agent is mixed with said gas beating said semi-conducting material in a quantity of between about 0.01 and 1.0% by volume of said gas bearing said semi-conducting material.

7. The method of claim 1 including doping said layer of said semi-conducting material with a doping agent after said depositing.

8. The method of claim 5 or 7 wherein said doping agent is selected from the group consisting of phosphorous and boron.

9. The method of claim 1 including admitting a vaporized metal into said chamber alter said layer of said semi-conducting material has been deposited on said substrate.

10. The method of claim 9 wherein said vaporized metal is selected from the group consisting of palladium, nickel and tungsten.

11. The method of claim 9 including sintering said metal so as to bond said metal to said layer of said semi-conducting material.

12. The method of claim 1 including exposing said substrate to a temperature of between about 650° and 700° C. before said depositing step.

13. The method of claim 1 including purging said chamber before said depositing step so as to clean said substrate.

14. The method of claim 13 wherein said purging is carried out utilizing hydrogen at a temperature of about 500° C.

15. The method of claim 1 including removing said substrate from said chamber following said depositing step, and flushing said chamber with nitrogen after said removing of said substrate therefrom.

16. A method of producing a droplet ejector comprising providing a piezoceramic wafer having first and second opposite planar surfaces, forming at least one longitudinally extending groove in said first planar surface so as to provide an ejector channel for a liquid, forming a plurality of grooves in said second planar surface, said plurality of grooves being offset relative to said at least one groove in said first planar surface and partially overlapping said at least one groove in said first planar surface in a direction perpendicular to said first and second opposite planar surfaces, providing a nozzle at one end of said at least one groove in said first planar surface, depositing a layer of a semi-conducting material on said piezoceramic wafer by thermally activated chemical vapor deposition, said depositing comprising placing said wafer in a heated deposition chamber at reduced pressure, and admitting a gas bearing said semi-conducting material into said chamber at pressure and temperature conditions such that said layer of semi-conducting material is smooth, said pressure being between about 13 and 200 Pa and said temperature being between about 300° an 700° C., forming electrodes by removing said layer of semi-conducting material from regions of said substrate, and polarizing said ejector by applying a voltage between said electrodes.

17. The method of claim 16 including bonding a cover plate to said wafer at a location so as to limit a longitudinal opening of said at least one groove in said first planar surface.

18. The method of claim 17 wherein said bonding comprises anodic bonding.

19. The method of claim 17 wherein said cover plate comprises glass.

\* \* \* \* \*

UNITED STATES PATENT AND TRADEMARK OFFICE
CERTIFICATE OF CORRECTION

PATENT NO. : 5,518,952
DATED : May 21, 1996
INVENTOR(S) : Vonasek et al.

It is certified that error appears in the above-identified patent and that said Letters Patent is hereby corrected as shown below:

Column 6, line 64, "beating" should read --bearing--

Column 7, line 7, "alter" should read --after--

Signed and Sealed this

Tenth Day of September, 1996

Attest:

BRUCE LEHMAN

Attesting Officer      Commissioner of Patents and Trademarks